United States Patent
Chang et al.

(10) Patent No.: US 11,256,588 B2
(45) Date of Patent: *Feb. 22, 2022

(54) SCAN SYNCHRONOUS-WRITE-THROUGH TESTING ARCHITECTURES FOR A MEMORY DEVICE

(71) Applicant: Taiwan Semiconductor Manufacturing Co., Ltd., Hsinchu (TW)

(72) Inventors: Ming-Hung Chang, Tainan (TW); Atul Katoch, Kanata (CA); Chia-En Huang, Hsinchu County (TW); Ching-Wei Wu, Nantou County (TW); Donald G. Mikan, Jr., Austin, TX (US); Hao-I Yang, Taipei (TW); Kao-Cheng Lin, Taipei (TW); Ming-Chien Tsai, Kaohsiung (TW); Saman M. I. Adham, Kanata (CA); Tsung-Yung Chang, Hsinchu (TW); Uppu Sharath Chandra, Austin, TX (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/888,013

(22) Filed: May 29, 2020

(65) Prior Publication Data

US 2020/0293417 A1    Sep. 17, 2020

Related U.S. Application Data

(63) Continuation of application No. 15/700,877, filed on Sep. 11, 2017, now Pat. No. 10,705,934.

(Continued)

(51) Int. Cl.
*G06F 11/263* (2006.01)
*G06F 1/10* (2006.01)
(Continued)

(52) U.S. Cl.
CPC ............ *G06F 11/263* (2013.01); *G06F 1/10* (2013.01); *G06F 11/2273* (2013.01);
(Continued)

(58) Field of Classification Search
CPC .. G06F 11/263; G06F 11/267; G06F 11/2273; G06F 1/10; G11C 29/1201;
(Continued)

(56) References Cited

U.S. PATENT DOCUMENTS

| 5,933,379 | A | 8/1999 | Park et al. |
| 7,869,293 | B2 | 1/2011 | Morein |

(Continued)

FOREIGN PATENT DOCUMENTS

| CN | 101256841 A | 9/2008 |
| CN | 101617242 A | 12/2009 |

(Continued)

OTHER PUBLICATIONS

Marinissen, E.J., et al.; A Structured and Scalable Test Access Architecture for TSV-Based 3D Stacked ICs, 2010 28th IEEE VLSI Test Symposium (VTS), pp. 269-274, ISSN 1093-0167; ISBN 978-1-4244-6648-1; 2010.

*Primary Examiner* — Cynthia Britt
(74) *Attorney, Agent, or Firm* — Sterne, Kessler, Goldstein & Fox P.L.L.C.

(57) ABSTRACT

An exemplary testing environment can operate in a testing mode of operation to test whether a memory device or other electronic devices communicatively coupled to the memory device operate as expected or unexpectedly as a result of one or more manufacturing faults. The testing mode of operation (Continued)

includes a shift mode of operation, a capture mode of operation, and/or a scan mode of operation. In the shift mode of operation and the scan mode of operation, the exemplary testing environment delivers a serial input sequence of data to the memory device. In the capture mode of operation, the exemplary testing environment delivers a parallel input sequence of data to the memory device. The memory device thereafter passes through the serial input sequence of data or the parallel input sequence of data to provide an output sequence of data in the shift mode of operation or the capture mode of operation or passes through the serial input sequence of data to provide a serial output sequence of scan data in the scan mode of operation.

20 Claims, 9 Drawing Sheets

Related U.S. Application Data

(60) Provisional application No. 62/527,331, filed on Jun. 30, 2017.

(51) Int. Cl.
*G06F 11/22* (2006.01)
*G06F 11/267* (2006.01)
*G11C 29/48* (2006.01)
*G11C 29/32* (2006.01)
*G11C 29/12* (2006.01)

(52) U.S. Cl.
CPC ........ *G06F 11/267* (2013.01); *G11C 29/1201* (2013.01); *G11C 29/32* (2013.01); *G11C 29/48* (2013.01)

(58) Field of Classification Search
CPC ......... G11C 29/32; G11C 29/48; G11C 29/56; G11C 29/36; G11C 29/26
See application file for complete search history.

(56) References Cited

U.S. PATENT DOCUMENTS

| | | | |
|---|---|---|---|
| 7,941,714 | B2 | 5/2011 | Cho et al. |
| 8,024,629 | B2 | 9/2011 | Louie et al. |
| 8,045,401 | B2 | 10/2011 | Chong et al. |
| 9,336,342 | B2 | 5/2016 | Zorian et al. |
| 9,373,417 | B2 | 6/2016 | Tong |
| 9,864,005 | B1 | 1/2018 | Carmean et al. |
| 10,249,380 | B2 * | 4/2019 | Chakraborty ........ G11C 29/022 |
| 2001/0015654 | A1 | 8/2001 | Habersetzer et al. |
| 2003/0142565 | A1 | 7/2003 | McClure |
| 2004/0123203 | A1 | 6/2004 | Nadeau-Dostie et al. |
| 2004/0230884 | A1 | 11/2004 | Rajski et al. |
| 2005/0041608 | A1 * | 2/2005 | Jeong .................. H04W 72/005 370/310 |
| 2006/0168491 | A1 * | 7/2006 | Lee ........................ G11C 29/02 714/733 |
| 2007/0011542 | A1 | 1/2007 | Mukherjee et al. |
| 2009/0190417 | A1 | 7/2009 | Ushikoshi et al. |
| 2010/0085818 | A1 | 4/2010 | Hwang |
| 2010/0309738 | A1 | 12/2010 | Na |
| 2011/0225400 | A1 * | 9/2011 | De Poy Alonso .... G06F 11/263 712/227 |
| 2011/0228621 | A1 | 9/2011 | Lee |
| 2013/0173971 | A1 | 7/2013 | Zimmerman |
| 2016/0196857 | A1 | 7/2016 | Lee |
| 2016/0282409 | A1 | 9/2016 | Nakamura |

FOREIGN PATENT DOCUMENTS

| | | |
|---|---|---|
| CN | 103917879 A | 7/2014 |
| CN | 104078082 A | 10/2014 |
| EP | 2 372 379 A1 | 10/2011 |
| TW | 201131571 A1 | 9/2011 |

* cited by examiner

SCAN SYNCHRONOUS-WRITE-THROUGH TESTING ARCHITECTURES FOR A MEMORY DEVICE

CROSS-REFERENCE TO RELATED APPLICATIONS

The present application is a continuation of U.S. patent application Ser. No. 15/700,877, Sep. 11, 2017, now U.S. Pat. No. 10,705,934, which claims the benefit of U.S. Provisional Patent Appl. No. 62/527,331, filed Jun. 30, 2017, each of which is incorporated herein by reference in its entirety.

BACKGROUND

A memory device is an electronic device for reading and/or writing electronic data. The memory device can be implemented as volatile memory, such as random-access memory (RAM), which requires power to maintain its stored information or non-volatile memory, such as read-only memory (ROM), which can maintain its stored information even when not powered. The RAM can be implemented in a dynamic random-access memory (DRAM), a static random-access memory (SRAM), and/or a non-volatile random-access memory (NVRAM), often referred to as a flash memory, configuration. The electronic data can be read from and/or written into an array of memory cells which can be accessible through various control lines. The two basic operations performed by the memory device are "read", in which the electronic data stored in the array of memory cells is read out, and "write" in which the electronic data is stored in the array of memory cells. In addition to the array of memory cells, the memory device includes peripheral circuitry to read the electronic data from the array of memory cells and to write the electronic data to the array of memory cells. Design for test, also referred to as design for testability, in the context of the memory device, supplements a design of the memory device with testability features to provide improved access to internal circuitry of the memory device, such as the peripheral circuitry to provide an example, to more easily control and/or observe this internal circuitry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
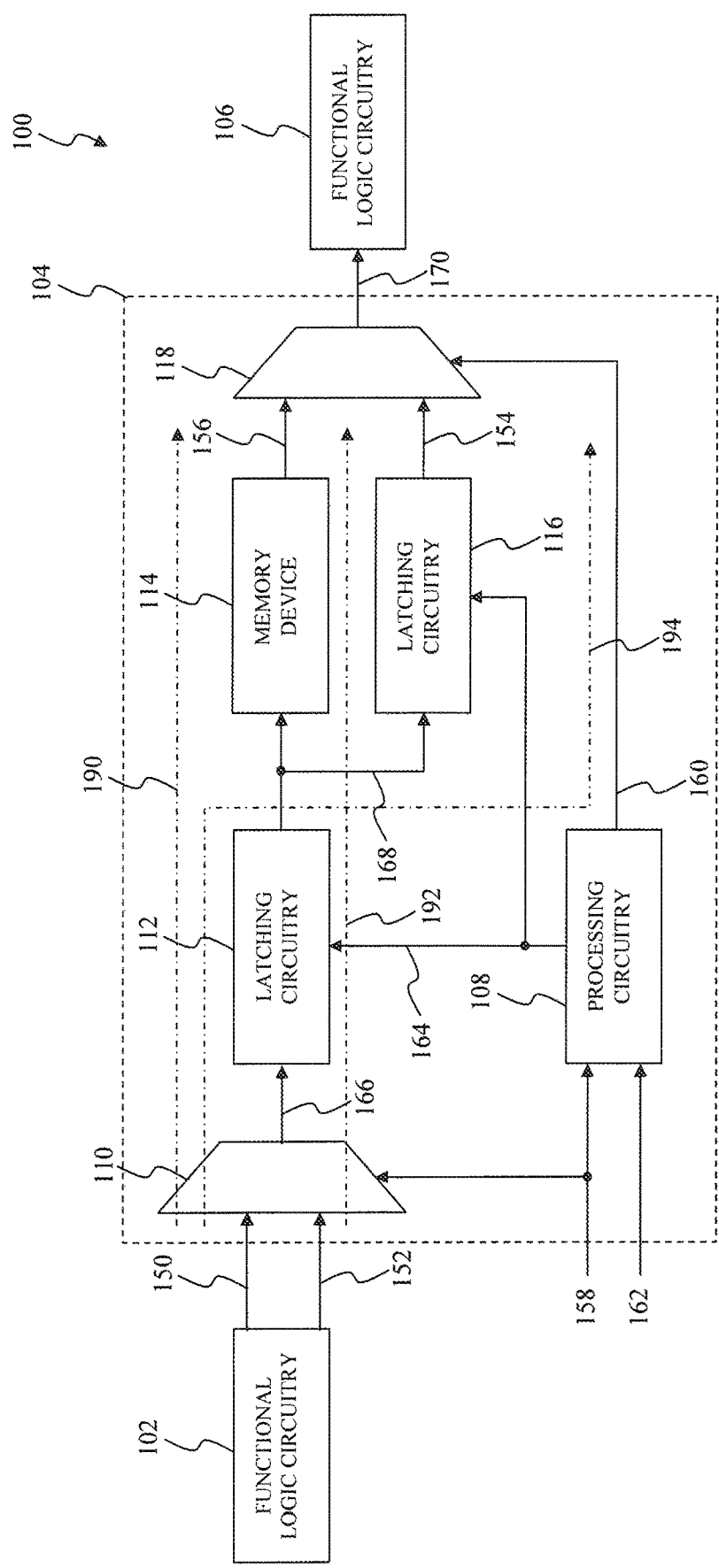
FIG. 1 illustrates a block diagram of an exemplary testing environment for testing a memory device according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is does not in itself dictate a relationship between the various embodiments and/or configurations described.

Overview

An exemplary testing environment can operate in a testing mode of operation to test whether a memory device or other electronic devices communicatively coupled to the memory device operate as expected or unexpectedly as a result of one or more manufacturing faults. The testing mode of operation includes a shift mode of operation, a capture mode of operation, and/or a scan mode of operation. In the shift mode of operation and the scan mode of operation, the exemplary testing environment delivers a serial input sequence of data to the memory device. In the capture mode of operation, the exemplary testing environment delivers a parallel input sequence of data to the memory device. The memory device thereafter passes through the serial input sequence of data or the parallel input sequence of data to provide an output sequence of data in the shift mode of operation or the capture mode of operation or passes through the serial input sequence of data to provide a serial output sequence of scan data in the scan mode of operation.

Exemplary Testing Environment for Testing a Memory Device

FIG. 1 illustrates a block diagram of an exemplary testing environment for testing a memory device according to an exemplary embodiment of the present disclosure. As illustrated in FIG. 1, an exemplary testing environment 100 can operate in a testing mode of operation to test whether a memory device or other electronic devices communicatively coupled to the memory device operate as expected or unexpectedly as a result of one or more manufacturing faults. The testing mode of operation includes a shift mode of operation, a capture mode of operation, and/or a scan mode of operation. The signal flow for the shift mode of operation is indicated by a direction 190, the signal flow for the capture mode of operation is indicated by a direction 192, and the signal flow for the scan mode of operation is indicated by a direction 194 in FIG. 1. In the shift mode of operation shown by the direction 190, the exemplary testing environment 100 delivers a serial input sequence of data to the memory device in accordance with a memory clocking signal for testing of the memory device for the presence of the one or more manufacturing faults. In the shift mode of operation, the memory device passes through the serial input sequence of data to provide a serial output sequence of data as an output sequence of test data in the shift mode of operation. Next, the exemplary testing environment 100 delivers the output sequence of test data in accordance with the memory clocking signal for verification of the functionality of the memory device.

In some situations, the memory device can be implemented within a larger system of other electronic devices. In these situations, the memory device can be utilized to assist testing of one or more of these other electronic devices for the presence of the one or more manufacturing faults in the capture mode of operation as shown by the direction 192 and/or the scan mode of operation as shown by the direction 194. In the capture mode of operation as shown by the direction 192, the exemplary testing environment 100 delivers a parallel input sequence of data to the memory device in accordance with the memory clocking signal. The memory device passes through the parallel input sequence of data to provide a parallel output sequence of data as the output sequence of test data in the capture mode of operation. Next, the exemplary testing environment 100 delivers the output sequence of test data in accordance with the memory clocking signal for testing of one or more of these other electronic devices. For example, the output sequence of test data can be used to electronically stress one or more of these other electronic devices to test for the presence of the one or more manufacturing faults.

Alternatively, the memory device and these other electronic devices can be configured and arranged to form a scan chain for testing the other electronic devices in the scan mode of operation as shown by the direction 194. In this alternate, the memory device can be configured and arranged to form a scanning flip-flop within this scan chain. For example, the memory device passes through the serial input sequence of data to provide a serial output sequence of scan data in the scan mode of operation. In this example, the memory device delivers the serial output sequence of scan data in accordance with the memory clocking signal to test for the presence of the one or more manufacturing faults within these other electronic devices. In an exemplary embodiment, the passing through of the serial input sequence of data in the scan mode of operation by the memory device can be referred to as a scan write-through. And as discussed above, the scan write through can be synchronized in accordance with the memory clocking signal to provide scan synchronous-write-through (SWT) testing of one or more of these other electronic devices.

Although not illustrated in FIG. 1, those skilled in the relevant art(s) will recognize the exemplary testing environment 100 can operate in a conventional read/write mode of operation without departing from the spirit and scope of the present disclosure. In the conventional write mode of operation, the memory device writes a write sequence of data into one or more memory cells. The memory device reads a read sequence of data from one or more memory cells in the conventional read mode of operation. The conventional read/write mode of operation is not to be described in further detail. In the exemplary embodiment illustrated in FIG. 1, the exemplary testing environment 100 includes first functional logic circuitry 102, a memory storage device 104, and second functional logic circuitry 106.

As illustrated in FIG. 1, the first functional logic circuitry 102 provides a serial input sequence of data 150 in the shift mode of operation as shown by the direction 190 and/or the scan mode of operation as shown by the direction 194 or a parallel input sequence of data 152 in the capture mode of operation as shown by the direction 192. As discussed above, the serial input sequence of data 150 can be utilized by the memory storage device 104 for testing for the presence of the one or more manufacturing faults in the shift mode of operation and/or for testing the second functional logic circuitry 106 for the presence of the one or more manufacturing faults in the scan mode of operation. The serial input sequence of data 150, when applied to the memory storage device 104 during the shift mode of operation, enables the second logic circuitry 106 to test whether the memory storage device 104 operates as expected or unexpectedly as a result of one or more manufacturing faults within the memory storage device 104. The serial input sequence of data 150, when applied to the memory storage device 104 during the scan mode of operation, enables the exemplary testing environment 100 to perform scan chain testing of the second logic circuitry 106 to test whether the second logic circuitry 106 operates as expected or unexpectedly as a result of one or more manufacturing faults within the second logic circuitry 106. And as also discussed above, the parallel input sequence of data 152 can be utilized by the memory storage device 104 to assist in testing the second functional logic circuitry 106 for the presence of the one or more manufacturing faults. The parallel input sequence of data 152, when passed through the memory storage device 104 during the capture mode of operation, enables the second logic circuitry 106 to be tested for the presence of the one or more manufacturing faults. The one or more manufacturing faults can include one or more assertion faults, one or more behavioral faults, one or more bridging faults, one or more delay faults, one or more functional faults, one or more gate-delay faults, one or more line-delay faults, one or more logical faults, one or more path-delay faults, one or more pin faults, one or more race faults, one or more transistor faults, one or more transition faults, and/or any other fault in the memory storage device 104 and/or the second functional logic circuitry 106 that will be apparent to those skilled in the relevant art(s) without departing from the spirit and scope of the present disclosure. In the exemplary embodiment illustrated in FIG. 1, the first functional logic circuitry 102 includes one or more logical gates, such as one or more logical AND gates, one or more logical OR gates, one or more logical INVERTER gates, one or more logical NAND gates, one or more logical NOR gates, or any combination thereof to provide some examples. In this exemplary embodiment, the one or more logical gates can be arranged to implement an automatic test pattern generator.

As additionally illustrated in FIG. 1, the memory storage device 104 selectively chooses between the serial input sequence of data 150 and the parallel input sequence of data 152. Thereafter, the memory storage device 104 operates on the serial input sequence of data 150 to generate a serial output sequence of test data as an output sequence of test data 156 in the shift mode of operation as shown by the direction 190 or on the parallel input sequence of data 152 to generate a parallel output sequence of data as the output sequence of test data 156 in the capture mode of operation as shown by the direction 192. Additionally, the memory device can pass through the serial input sequence of data 150 to provide a serial output sequence of scan data 154 in the scan mode of operation as shown by the direction 194.

In the exemplary embodiment illustrated in FIG. 1, the memory storage device 104 includes processing circuitry 108, first multiplexing circuitry 110, first latching circuitry 112, a memory device 114, second latching circuitry 116, and second multiplexing circuitry 118. The processing circuitry 108 controls overall configuration and/or operation of the memory storage device 104. In the exemplary embodiment illustrated in FIG. 1, the processing circuitry 108 receives a mode of operation control signal 158 to cause the memory storage device 104 to enter into the capture mode of operation as shown by the direction 192, when at a first logical level, such as a logical zero to provide an example, or in the shift mode of operation as shown by the direction 190 or the scan mode of operation as shown by the direction 194, when at a second logical level, such as a logical one to provide an example. The processing circuitry 108 can provide a mode of operation control signal 160 to control configuration and/or operation of the second multiplexing circuitry 118 which is to be discussed in further detail below. As to be described in further detail below, the processing circuitry 108 can provide the mode of operation control signal 160 at the first logical level, such as a logical zero to provide an example, to cause the second multiplexing circuitry 118 provide the output sequence of test data 156 to the second functional logic circuitry 106 or the second logical level, such as a logical one to provide an example, to cause the second multiplexing circuitry 118 provide the serial output sequence of scan data 154 to the second functional logic circuitry 106. As such, the memory storage device 104 is characterized as operating in the shift mode of operation as shown by the direction 190 when the mode of operation control signal 158 is at the first logical level and the mode of operation control signal 160 is at the first logical level, in the capture mode of operation as shown by the direction 192 when the mode of operation control signal 158 is at the second logical level and the mode of operation control signal 160 is at the first logical level, and the scan mode of operation as shown by the direction 194 when the mode of operation control signal 158 is at the first logical level and the mode of operation control signal 160 is at the second logical level. Also in the exemplary embodiment illustrated in FIG. 1, the processing circuitry 108 can provide a memory clocking signal 164 based on a memory clocking signal 162. In some situations, the processing circuitry 108 can adjust an amplitude, a frequency and/or a phase of the memory clocking signal 162 to provide the memory clocking signal 164.

The first multiplexing circuitry 110 selectively provides the serial input sequence of data 150 or the parallel input sequence of data 152 as an input sequence of data 166 based upon the mode of operation control signal 158. The first multiplexing circuitry 110 selectively provides the serial input sequence of data 150 as the input sequence of data 166 when the mode of operation control signal 158 at the first logical level, such as a logical zero to provide an example. The first multiplexing circuitry 110 selectively provides the parallel input sequence of data 152 as the input sequence of data 166 when the mode of operation control signal 158 is at the second logical level, such as a logical one to provide an example. In an exemplary embodiment and as discussed above, the first multiplexing circuitry 110 selectively provides the serial input sequence of data 150 to test whether the memory storage device 104 operates as expected or unexpectedly as a result of the one or more manufacturing faults within the memory storage device 104 in the shift mode of operation as shown by the direction 190 or to assist in testing the second functional logic circuitry 106 for the presence of the one or more manufacturing faults in the scan mode of operation as shown by the direction 194. Otherwise, the first multiplexing circuitry 110 selectively provides the parallel input sequence of data 152 to assist in testing the second functional logic circuitry 106 for the presence of the one or more manufacturing faults in the capture mode of operation as shown by the direction 192.

The first latching circuitry 112 provides the input sequence of data 166 as a testing sequence of data 168 in accordance with the memory clocking signal 164 in the shift mode of operation as shown by the direction 190 and in the capture mode of operation as shown by the direction 192. In an exemplary embodiment, the first latching circuitry 112 includes one or more gated latches to provide the input sequence of data 166 as the testing sequence of data 168 upon a rising edge, namely a transition from a logical zero to a logical one, of the memory clocking signal 164. The one or more gated latches can include one or more gated set-reset (SR) logical NOR latches, one or more gated SR logical NAND latches, one or more SR gated logical AND-OR latches, and/or one or more gated JK latches to provide some examples.

In the exemplary embodiment illustrated in FIG. 1, the memory device 114 includes a memory array, internal circuitry under test, and internal circuitry not under test. The internal circuitry under test represents circuitry within the memory device 114, such as a sense amplifier/write driver, and/or an output latch to provide some examples, that operates on the testing sequence of data 168 to generate the output sequence of test data 156 to test whether the memory storage device 104 operates as expected or unexpectedly as a result of the one or more manufacturing faults within the memory storage device 104 in the shift mode of operation as shown by the direction 190 and or to assist in testing the second functional logic circuitry 106 for the presence of the one or more manufacturing faults in the capture mode of operation as shown by the direction 192. The internal circuitry not under test represents circuitry within the memory device 114, such as a memory array, row selection circuitry, and/or column selection circuitry to provide some examples, that is not undergoing the testing in the shift mode of operation and the capture mode of operation. In some situations, the memory array and/or the internal circuitry not under test can be disabled, for example, turned-off, to save power in the testing mode of operation. The memory device 114 is further described in FIG. 2.

The second latching circuitry 116 provides the testing sequence of data 168 as the serial output sequence of scan data 154 in accordance with the memory clocking signal 164 to assist in testing the second functional logic circuitry 106 for the presence of the one or more manufacturing faults in the scan mode of operation as shown by the direction 194. In an exemplary embodiment, the second latching circuitry 116 includes one or more gated latches to provide the testing sequence of data 168 as the serial output sequence of scan data 154 upon a falling edge, namely a transition from a logical one to a logical zero, of the memory clocking signal 164. The one or more gated latches can include one or more gated set-reset (SR) logical NOR latches, one or more gated SR logical NAND latches, one or more SR gated logical AND-OR latches, and/or one or more gated JK latches to provide some examples.

The second multiplexing circuitry 118 selectively provides the serial output sequence of scan data 154 or the output sequence of test data 156 as an output sequence of data 170 based upon the mode of operation control signal 160. The second multiplexing circuitry 118 selectively provides the output sequence of test data 156 as the output sequence of data 170 when the mode of operation control signal 160 at the first logical level, such as a logical zero to provide an example. The second multiplexing circuitry 118 selectively provides the serial output sequence of scan data 154 as the output sequence of data 170 when the mode of operation control signal 160 at the second logical level, such as a logical one to provide an example. In an exemplary embodiment and as discussed above, the second multiplexing circuitry 118 selectively provides the serial output sequence of scan data 154 to assist in testing the second functional logic circuitry 106 for the presence of the one or more manufacturing faults in the scan mode of operation as shown by the direction 194. In this exemplary embodiment, the second multiplexing circuitry 118 selectively provides the output sequence of test data 156 to test whether the memory storage device 104 operates as expected or unexpectedly as a result of the one or more manufacturing faults within the memory storage device 104 in the shift mode of operation as shown by the direction 190 or to assist in testing the second functional logic circuitry 106 for the presence of the one or more manufacturing faults in the capture mode of operation as shown by the direction 192.

As further illustrated in FIG. 1, the second functional logic circuitry 106 receives the output sequence of data 170 from the memory storage device 104. In an exemplary embodiment, the second functional logic circuitry 106 compares the output sequence of data 170 as received from the memory storage device 104 with an expected value of the output sequence of data 170 that corresponds to the serial input sequence of data 150 in the shift mode of operation as shown by the direction 190. When the output sequence of data 170 as received from the memory storage device 104 matches the expected value of the output sequence of data 170, the internal circuitry under test of the memory storage device 104 operates as expected. However, when the output sequence of data 170 as received from the memory storage device 104 does not match the expected value of the output sequence of data 170, the internal circuitry under test of the memory storage device 104 operates unexpectedly as a result of the one or more manufacturing faults within the memory storage device 104. In another exemplary embodiment and as also discussed above, the second functional logic circuitry 106 represents one or more other electronic devices communicatively coupled to the memory storage device 104. In this other exemplary embodiment, the output sequence of data 170 as received from the memory storage device 104 is applied to the second functional logic circuitry 106 to electronically stress the second functional logic circuitry 106 to test for the presence of the one or more manufacturing faults within the second functional logic circuitry 106 in the capture mode of operation as shown by the direction 192 and the scan mode of operation as shown by the direction 194.

Exemplary Memory Device

Figure 2:
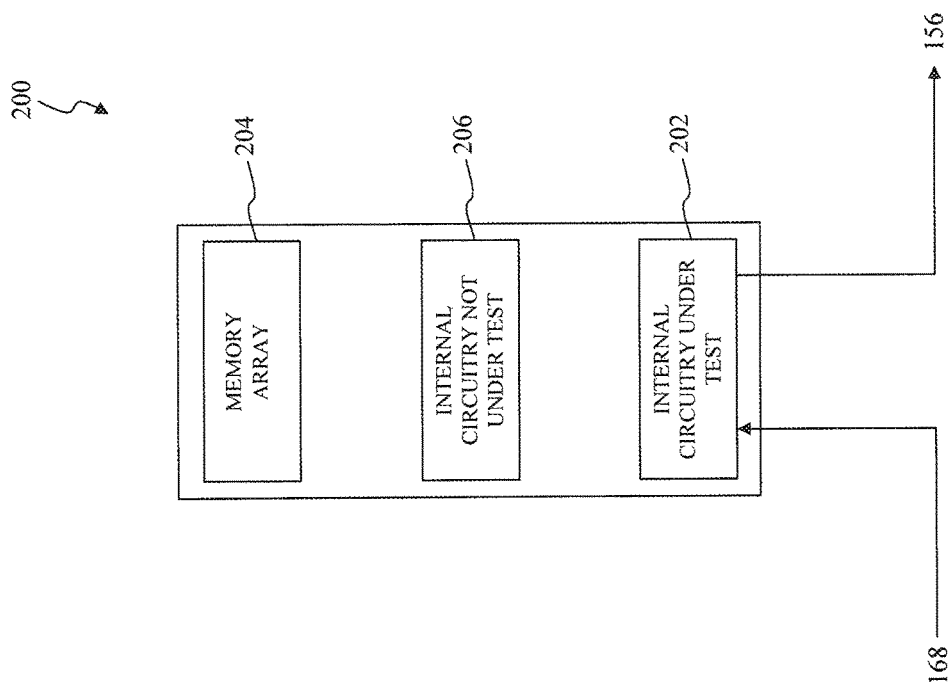
FIG. 2 illustrates a block diagram of a memory device according to an exemplary embodiment of the present disclosure.

FIG. 2 illustrates a block diagram of a memory device according to an exemplary embodiment of the present disclosure. A memory device 200 operates in the testing mode of operation, as described above in FIG. 1. In the testing mode of operation as illustrated in FIG. 2, the memory device 200 operates on the testing sequence of data 168 to provide the output sequence of test data 156. The testing sequence of data 168 represents the serial input sequence of data 150 in the shift mode of operation or the parallel input sequence of data 152 in the capture mode of operation. In the exemplary embodiment illustrated in FIG. 2, the memory device 200 includes internal circuitry under test 202, a memory array 204, and internal circuitry not under test 206. The memory device 200 can represent an exemplary embodiment of the memory device 114 as described above in FIG. 1.

As illustrated in FIG. 2, the internal circuitry under test 202 receives the testing sequence of data 168 in the shift mode of operation and the capture mode of operation, as described above in FIG. 1. Thereafter, the internal circuitry under test 202 operates on the testing sequence of data 168. For example, the internal circuitry under test 202 can operate on the testing sequence of data 168 in the shift mode of operation to test for the presence of the one or more manufacturing faults within the internal circuitry under test 202. As another example, the internal circuitry under test 202 can pass-through the testing sequence of data 168, without further processing, which can thereafter be used to electronically stress the second functional logic circuitry 106 to test for the presence of the one or more manufacturing faults within the second functional logic circuitry 106. Next, the internal circuitry under test 202 delivers the output sequence of test data 156. In an exemplary embodiment, the internal circuitry under test 202 can include a sense amplifier/write driver, and/or an output latch to provide some examples. In some situations, the memory array 204 and/or the internal circuitry not under test 206, such as row selection circuitry, and/or column selection circuitry to provide some examples, can be disabled, for example, turned-off, to save power in the testing mode of operation.

First Exemplary Memory Device

Figure 3:
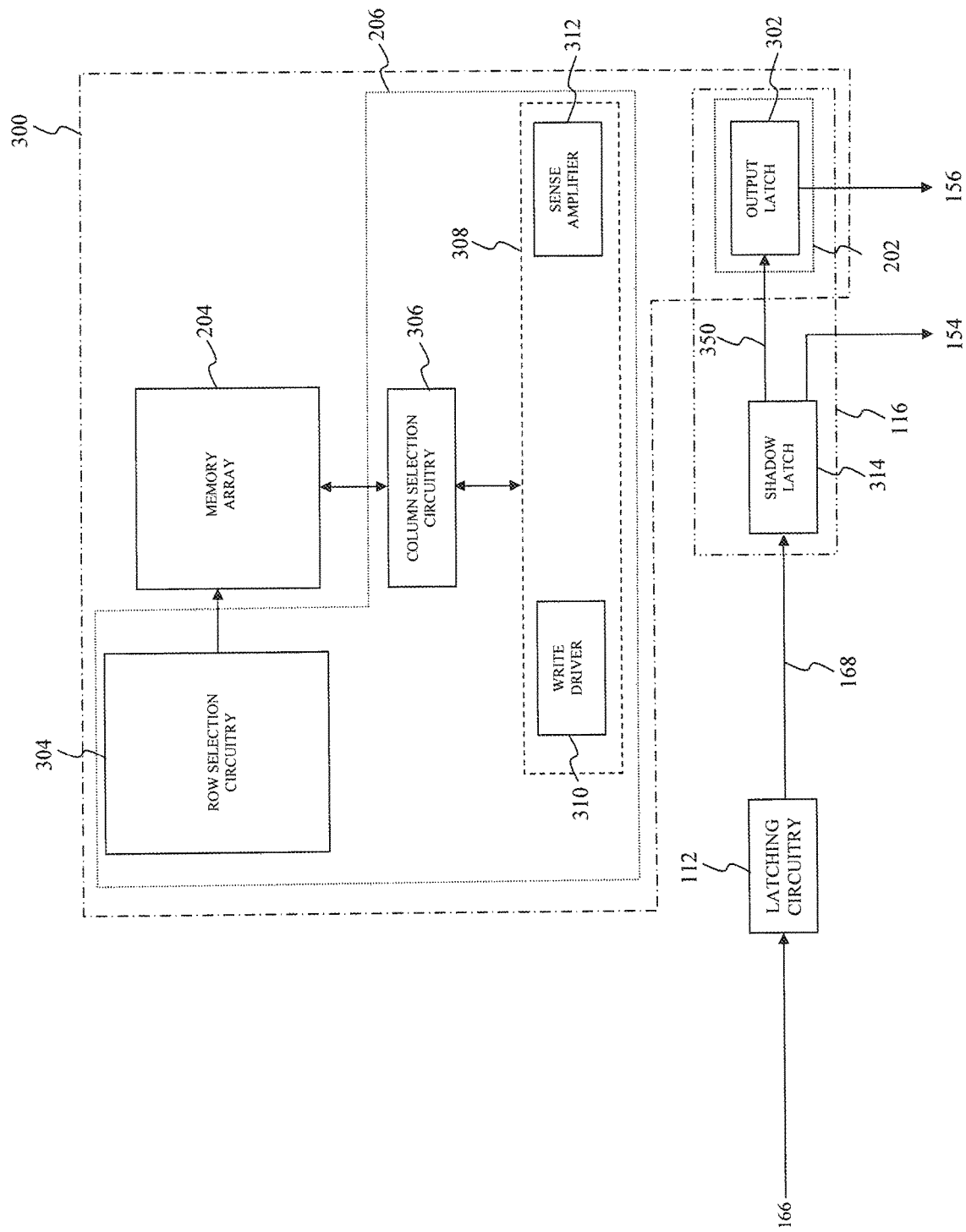
FIG. 3 illustrates a block diagram of a first exemplary embodiment for the memory device according to an exemplary embodiment of the present disclosure.

FIG. 3 illustrates a block diagram of a first exemplary embodiment for the memory device according to an exemplary embodiment of the present disclosure. As illustrated in FIG. 3, a memory device 300 operates in the conventional read/write mode of operation and/or in the testing mode of operation as described above in FIG. 1 and FIG. 2. The conventional read/write mode of operation is not to be described in further detail. As such various circuitry and/or various interconnections to operate in the conventional read/write mode of operation are not illustrated in FIG. 3. However, these circuitry and/or interconnections will be readily apparent to those skilled in the relevant art(s) without departing from the spirit and scope of the present disclosure. In the shift mode of operation as described above in FIG. 1 and FIG. 2, the memory device 300 determines whether it operates as expected or unexpectedly as a result of the one or more manufacturing faults within the memory device 300. Otherwise, the memory device 300 assists in testing of one or more other electronic devices communicatively coupled to the memory device 300 for the presence of the one or more manufacturing faults in the capture mode of operation and/or the scan mode of operation as described above in FIG. 1 and FIG. 2. As illustrated in FIG. 3, the memory device 300 includes the internal circuitry under test 202, the memory array 204, the internal circuitry not under test 206. The memory device 300 can represent an exemplary embodiment of the memory device 200 as described above in FIG. 2.

In the exemplary embodiment illustrated in FIG. 3, the first latching circuitry 112 provides the input sequence of data 166 as the testing sequence of data 168 in the shift mode of operation, in the capture mode of operation, and in the scan mode of operation as described above in FIG. 1. The second latching circuitry 116 similarly provides the testing sequence of data 168 as the serial output sequence of scan data 154 in the scan mode of operation as described above in FIG. 1. Also, the second latching circuitry 116 can provide the testing sequence of data 168 as a testing sequence of data 350 to the memory device 300 in the shift mode of operation and the capture mode of operation. In the exemplary embodiment illustrated in FIG. 3, the second latching circuitry 116 includes a shadow latch 314 and an output latch 302. In an exemplary embodiment, the shadow latch 314 includes one or more gated latches to provide the serial output sequence of scan data 154 and the testing sequence of data 350 upon a falling edge, namely a transition from a logical one to a logical zero, of a memory clocking signal, such as the memory clocking signal 164 to provide an example. The one or more gated latches can include one or more gated set-reset (SR) logical NOR latches, one or more gated SR logical NAND latches, one or more SR gated logical AND-OR latches, and/or one or more gated JK latches to provide some examples.

As illustrated in FIG. 3, the memory device 300 operates on the testing sequence of data 350 to generate the output sequence of test data 156 in the shift mode of operation and the capture mode of operation. In the exemplary embodiment illustrated in FIG. 3, the internal circuitry under test 202 includes the output latch 302 and the internal circuitry not under test 206 having row selection circuitry 304, column selection circuitry 306, and a sense amplifier/write driver 308, having a write driver 310 and a sense amplifier 312. In this exemplary embodiment, the memory array 204, the row selection circuitry 304, the column selection circuitry 306, and the sense amplifier/write driver 308 can be disabled, for example, turned-off, to save power in the testing mode of operation.

In the shift mode of operation and the capture mode of operation, as described above in FIG. 1 and FIG. 2, the output latch 302 receives the testing sequence of data 350. Thereafter, the output latch 302 operates on the testing sequence of data 350 to generate the output sequence of test data 156 in the shift mode of operation and the capture mode of operation. Next, in the shift mode of operation and the capture mode of operation, the output latch 302 delivers the output sequence of test data 156. In an exemplary embodiment, the output latch 302 includes one or more gated latches to provide the output sequence of test data 156 upon a falling edge, namely a transition from a logical one to a logical zero, of the memory clocking signal, such as the memory clocking signal 164 to provide an example.

Second Exemplary Memory Device

Figure 4:
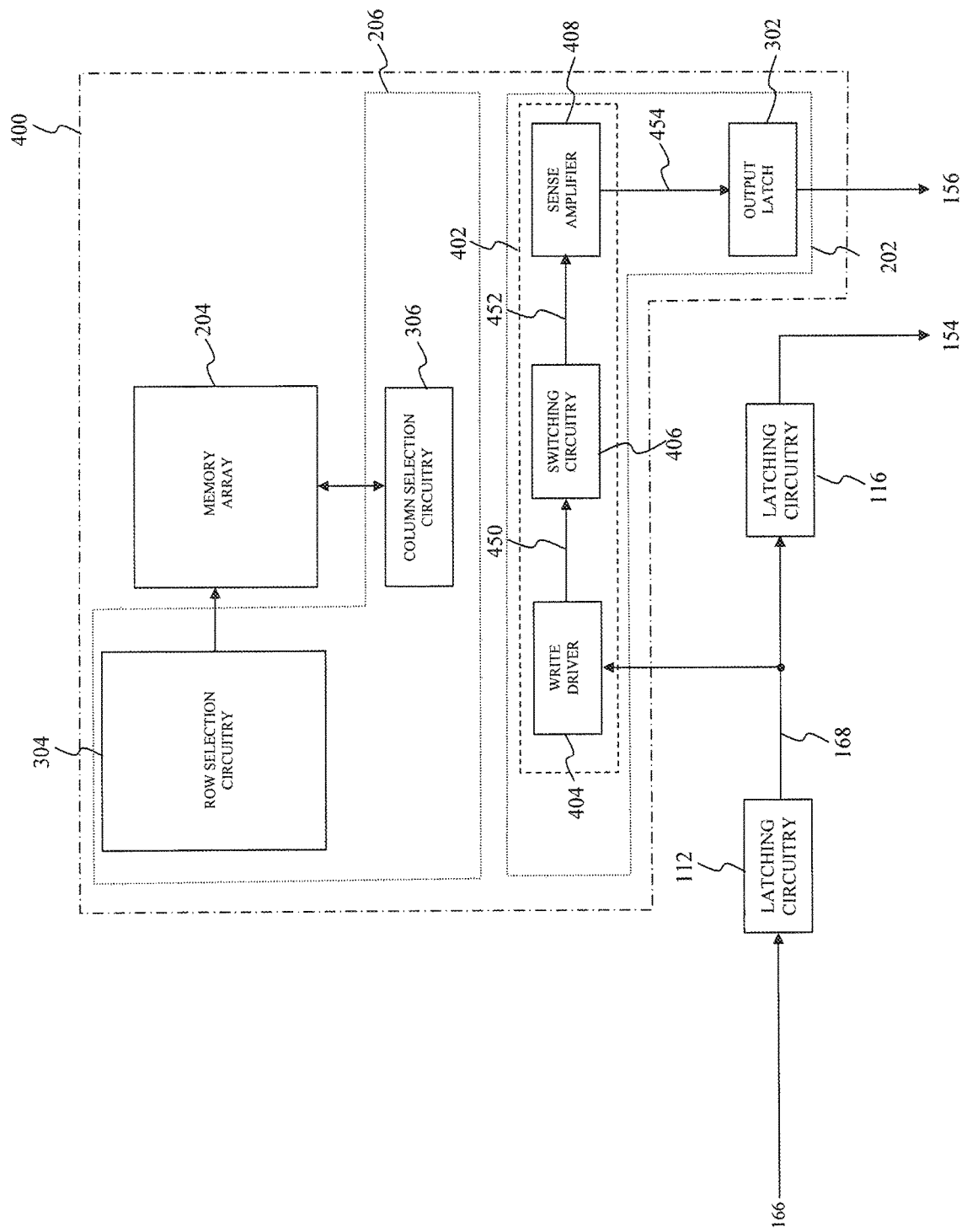
FIG. 4 illustrates a block diagram of a second exemplary embodiment for the memory device according to an exemplary embodiment of the present disclosure.

FIG. 4 illustrates a block diagram of a second exemplary embodiment for the memory device according to an exemplary embodiment of the present disclosure. As illustrated in FIG. 4, a memory device 400 operates in the conventional read/write mode of operation and/or in the testing mode of operation as described above in FIG. 1 and FIG. 2. The conventional read/write mode of operation is not to be described in further detail. As such various circuitry and/or various interconnections to operate in the conventional read/write mode of operation are not illustrated in FIG. 4. However, these circuitry and/or interconnections will be readily apparent to those skilled in the relevant art(s) without departing from the spirit and scope of the present disclosure. In the shift mode of operation as described above in FIG. 1 and FIG. 2, the memory device 400 determines whether it operates as expected or unexpectedly as a result of the one or more manufacturing faults within the memory device 400. Otherwise, the memory device 400 assists in testing of one or more other electronic devices communicatively coupled to the memory device 400 for the presence of the one or more manufacturing faults in the capture mode of operation and/or the scan mode of operation as described above in FIG. 1 and FIG. 2. As illustrated in FIG. 4, the memory device 400 includes the internal circuitry under test 202, the memory array 204, the internal circuitry not under test 206. The memory device 400 can represent an exemplary embodiment of the memory device 200 as described above in FIG. 2.

In the exemplary embodiment illustrated in FIG. 4, the first latching circuitry 112 provides the input sequence of data 166 as the testing sequence of data 168 in the shift mode of operation, in the capture mode of operation, and in the scan mode of operation as described above in FIG. 1. The second latching circuitry 116 similarly provides the testing sequence of data 168 as the serial output sequence of scan data 154 in the scan mode of operation as described above in FIG. 1.

As illustrated in FIG. 4, the memory device 400 operates on the testing sequence of data 350 to generate the output sequence of test data 156 in the shift mode of operation and the capture mode of operation. In the exemplary embodiment illustrated in FIG. 4, the internal circuitry under test 202 includes the output latch 302 and a sense amplifier/write driver 408 having a write driver 404, switching circuitry 406, and a sense amplifier 408 and the internal circuitry not under test 206 includes the row selection circuitry 304 and the column selection circuitry 306. In this exemplary embodiment, the memory array 204, the row selection circuitry 304 and the column selection circuitry 306 can be disabled, for example, turned-off, to save power in the testing mode of operation.

In the shift mode of operation and the capture mode of operation, as described above in FIG. 1 and FIG. 2, the write driver 404 operates on the testing sequence of data 168 to generate a testing sequence of data 450. For example, the write driver 404 operates on the testing sequence of data 168 in a substantially similar manner as if the write driver 404 were to write the testing sequence of data 168 to one or more memory cells of the memory array 204 in the conventional write mode of operation. Thereafter, the switching circuitry 406 couples the write driver 404 to the sense amplifier 408 in the shift mode of operation and the capture mode of operation to provide testing sequence of data 452 from the testing sequence of data 450. However, in the conventional read/write mode of operation, the switching circuitry 406 decouples the write driver 404 to the sense amplifier 408 allowing the write driver 404 to write a sequence of data to the memory array 204 and the sense amplifier to read a sequence of data from the memory array. Next in the shift mode of operation and the capture mode of operation, as described above in FIG. 1 and FIG. 2, the sense amplifier 408 operates on the testing sequence of data 452 to generate a testing sequence of data 454. For example, the sense amplifier 408 operates on the testing sequence of data 452 in a substantially similar manner as if the sense amplifier 408 were to sense the testing sequence of data 452 from the one or more memory cells of the memory array 204 in the conventional read mode of operation. Thereafter, in the shift mode of operation and the capture mode of operation, as described above in FIG. 1 and FIG. 2, the output latch 302 operates on the testing sequence of data 454 to generate the output sequence of test data 156. Next, in the shift mode of operation, as described above in FIG. 1 and FIG. 2, the output latch 302 delivers the output sequence of test data 156.

Third Exemplary Memory Device

Figure 5:
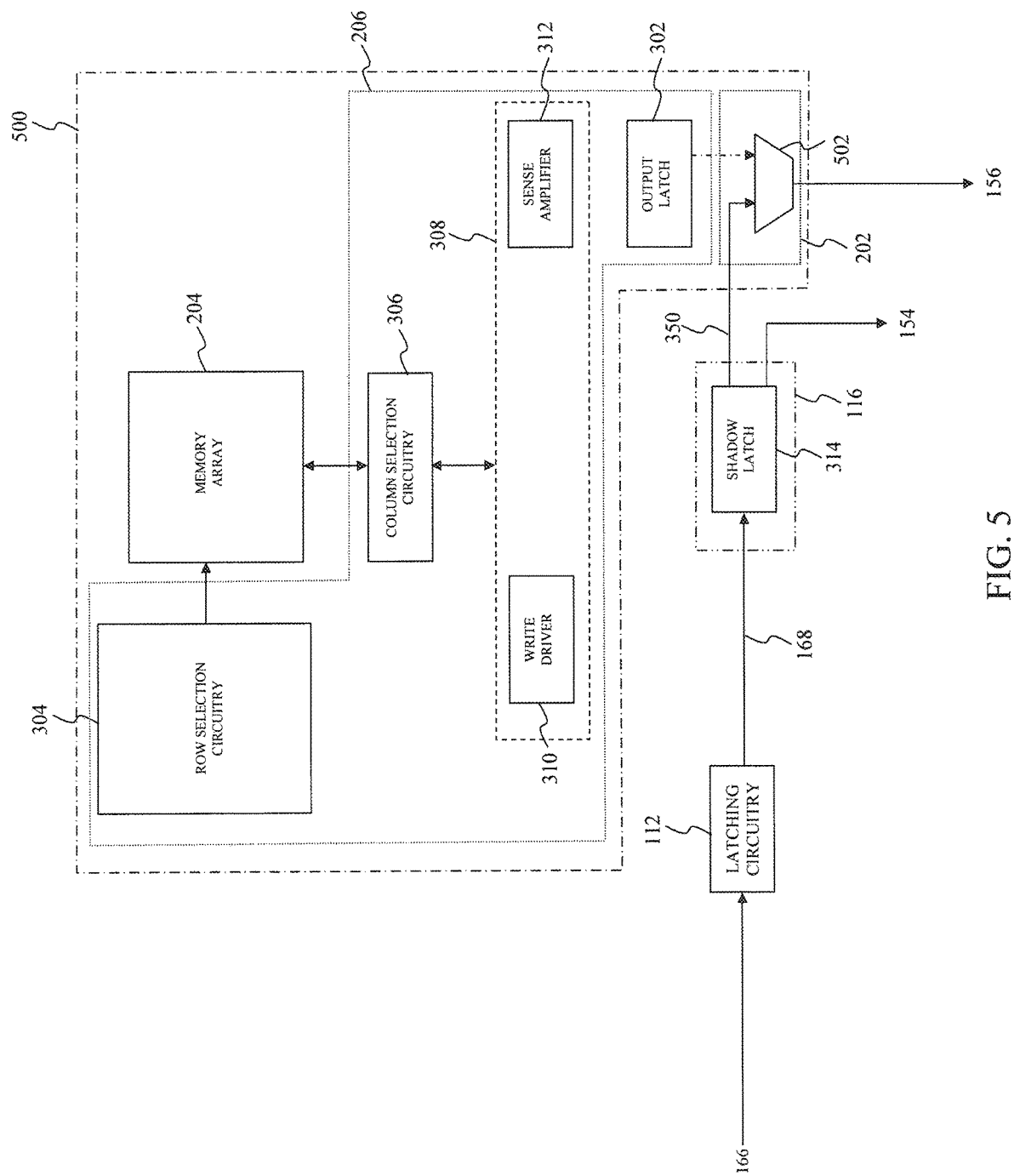
FIG. 5 illustrates a block diagram of a third exemplary embodiment for the memory device according to an exemplary embodiment of the present disclosure.

FIG. 5 illustrates a block diagram of a third exemplary embodiment for the memory device according to an exemplary embodiment of the present disclosure. As illustrated in FIG. 5, a memory device 500 operates in the conventional read/write mode of operation and/or in the testing mode of operation as described above in FIG. 1 and FIG. 2. The conventional read/write mode of operation is not to be described in further detail. As such various circuitry and/or various interconnections to operate in the conventional read/write mode of operation are not illustrated in FIG. 5. However, these circuitry and/or interconnections will be readily apparent to those skilled in the relevant art(s) without departing from the spirit and scope of the present disclosure. In the shift mode of operation as described above in FIG. 1 and FIG. 2, the memory device 500 determines whether it operates as expected or unexpectedly as a result of the one or more manufacturing faults within the memory device 500. Otherwise, the memory device 500 assists in testing of one or more other electronic devices communicatively coupled to the memory device 500 for the presence of the one or more manufacturing faults in the capture mode of operation and/or the scan mode of operation as described above in FIG. 1 and FIG. 2. As illustrated in FIG. 5, the memory device 500 includes the internal circuitry under test 202, the memory array 204, the internal circuitry not under test 206. The memory device 500 can represent an exemplary embodiment of the memory device 200 as described above in FIG. 2.

In the exemplary embodiment illustrated in FIG. 5, the first latching circuitry 112 provides the input sequence of data 166 as the testing sequence of data 168 in the shift mode of operation, in the capture mode of operation, and in the scan mode of operation as described above in FIG. 1. The second latching circuitry 116 similarly provides the testing sequence of data 168 as the serial output sequence of scan data 154 in the scan mode of operation as described above in FIG. 1. Also, the second latching circuitry 116 can provide the testing sequence of data 168 as the testing sequence of data 350 to the memory device 300 in the shift mode of operation and the capture mode of operation.

As illustrated in FIG. 5, the memory device 500 operates on the testing sequence of data 350 to generate the output sequence of test data 156 in the shift mode of operation and the capture mode of operation. In the exemplary embodiment illustrated in FIG. 5, the internal circuitry under test 202 includes multiplexing circuitry 502 and the internal circuitry not under test 206 includes the output latch 302, the row selection circuitry 304, the column selection circuitry 306, and the sense amplifier/write driver 308, having the write driver 310 and the sense amplifier 312. In this exemplary embodiment, the memory array 204, the output latch 302, the row selection circuitry 304, the column selection circuitry 306, and the sense amplifier/write driver 308 can be disabled, for example, turned-off, to save power in the testing mode of operation.

In the shift mode of operation and the capture mode of operation, as described above in FIG. 1 and FIG. 2, the multiplexing circuitry 502 receives the testing sequence of data 350. Thereafter, in the shift mode of operation and the capture mode of operation, as described above in FIG. 1 and FIG. 2, the multiplexing circuitry 502 selectively provides the testing sequence of data 350 as the output sequence of test data 156 in the shift mode of operation and the capture mode of operation. However, in the conventional read mode of operation, the multiplexing circuitry 502 selects a sequence of data, shown as a dashed arrow in FIG. 5, read from one or more memory cells of the memory array 204 as sensed by the sense amplifier 312 in the conventional read mode of operation.

Fourth Exemplary Memory Device

Figure 6:
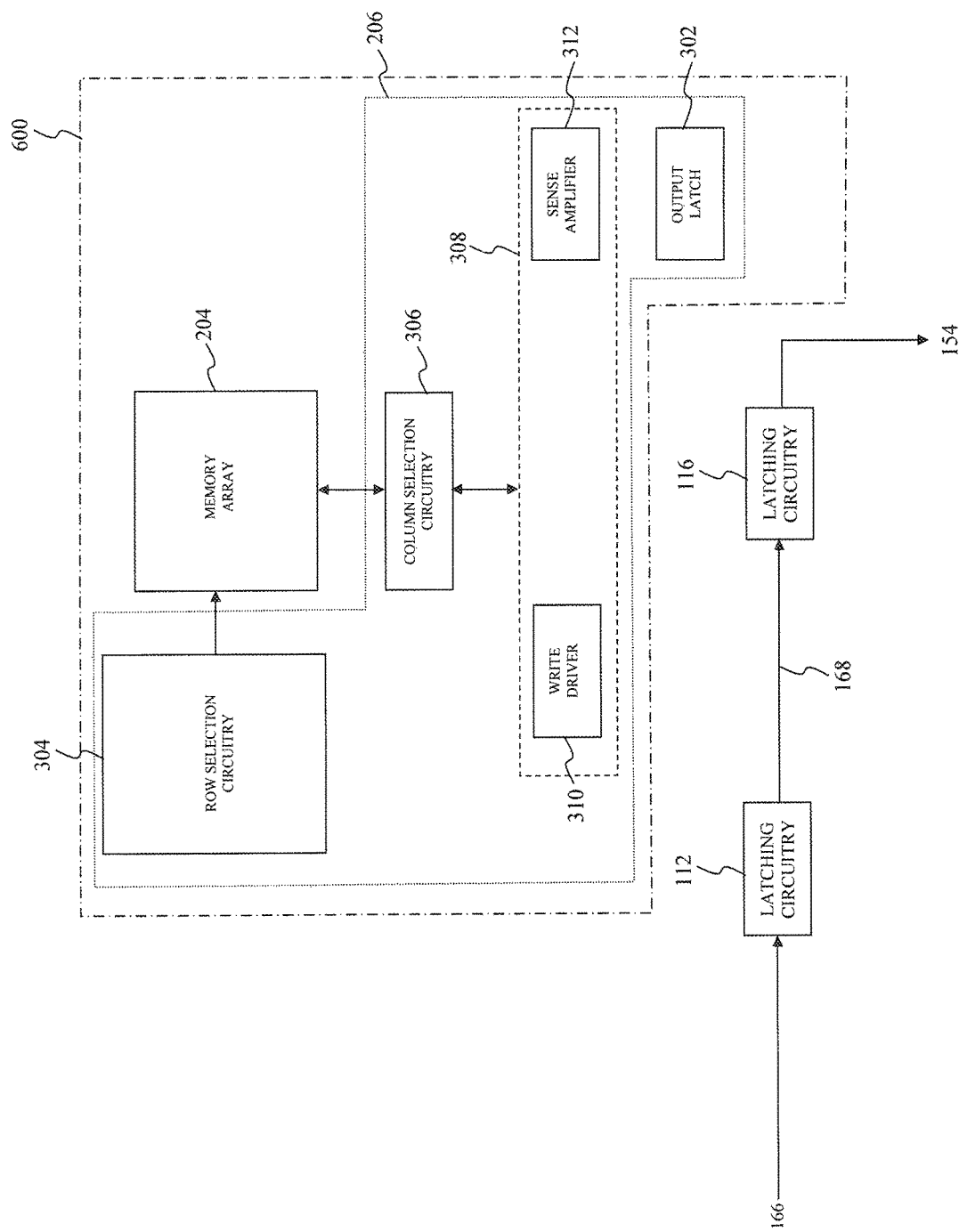
FIG. 6 illustrates a block diagram of a fourth exemplary embodiment for the memory device according to an exemplary embodiment of the present disclosure.

FIG. 6 illustrates a block diagram of a fourth exemplary embodiment for the memory device according to an exemplary embodiment of the present disclosure. As illustrated in FIG. 6, a memory device 600 operates in the conventional read/write mode of operation and/or in the testing mode of operation as described above in FIG. 1 and FIG. 2. The conventional read/write mode of operation is not to be described in further detail. As such various circuitry and/or various interconnections to operate in the conventional read/write mode of operation are not illustrated in FIG. 6. However, these circuitry and/or interconnections will be readily apparent to those skilled in the relevant art(s) without departing from the spirit and scope of the present disclosure. In the scan mode of operation as described above in FIG. 1 and FIG. 2, the memory device 600 assists in testing of one or more other electronic devices communicatively coupled to the memory device 600 for the presence of the one or more manufacturing faults as described above in FIG. 1 and FIG. 2. As illustrated in FIG. 6, the memory device 600 includes the memory array 204 and the internal circuitry not under test 206. The memory device 600 can represent an exemplary embodiment of the memory device 200 as described above in FIG. 2.

As illustrated in FIG. 6, the first latching circuitry 112 provides the input sequence of data 166 as the testing sequence of data 168 in the shift mode of operation, in the capture mode of operation, and in the scan mode of operation as described above in FIG. 1. The second latching circuitry 116 similarly provides the testing sequence of data 168 as the serial output sequence of scan data 154 in the scan mode of operation as described above in FIG. 1.

In the exemplary embodiment illustrated in FIG. 6, the internal circuitry not under test 206 includes the output latch 302, the row selection circuitry 304, the column selection circuitry 306, and the sense amplifier/write driver 308, having the write driver 310 and the sense amplifier 312. In this exemplary embodiment, the memory array 204, the output latch 302, the row selection circuitry 304, the column selection circuitry 306, and the sense amplifier/write driver 308 can be disabled, for example, turned-off, to save power in the testing mode of operation.

Figure 7:
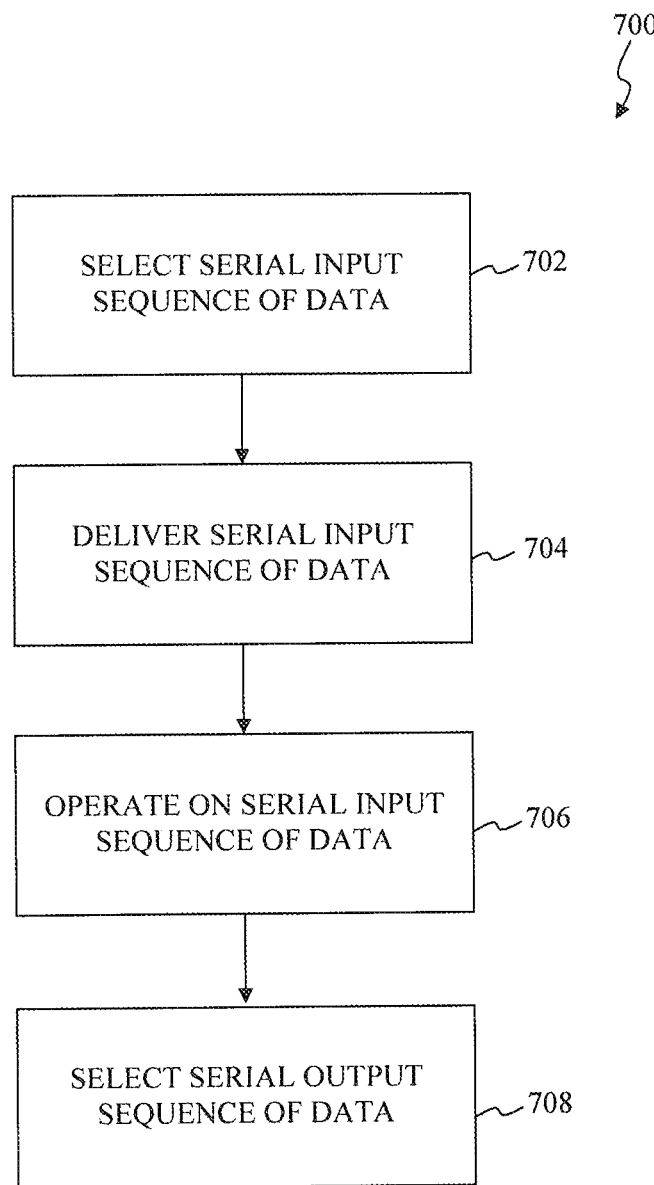
FIG. 7 illustrates a flowchart of an exemplary shift mode of operation of the exemplary testing environment according to an exemplary embodiment of the present disclosure.

Exemplary Shift Mode of Operation of the
Exemplary Testing Environment for Testing the
Memory Device FIG. 7 illustrates a flowchart of an exemplary shift mode of operation of the exemplary testing environment according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes exemplary operation flow 700 for a shift mode of operation of an exemplary testing environment, such as the exemplary testing environment 100 to provide an example.

At step 702, the exemplary operation flow 700 selects a serial input sequence of data, such as the serial input sequence of data 150 to provide an example, from among the serial input sequence of data and a parallel input sequence of data, such as the parallel input sequence of data 152 to provide an example, in the shift mode of operation. In an exemplary embodiment, multiplexing circuitry, such as the first multiplexing circuitry 110 to provide an example, selects the serial input sequence of data from among the serial input sequence of data and the parallel input sequence of data.

At step 704, the exemplary operation flow 700 delivers the serial input sequence of data to a memory device, such as the memory device 114, the memory device 200, the memory device 300, the memory device 400, the memory device 500, or the memory device 600 to provide some examples, in the shift mode of operation. In an exemplary embodiment, latching circuitry, such as the first latching circuitry 112 to provide an example, delivers the serial input sequence of data to the memory device in accordance with a memory clocking signal, such as the memory clocking signal 164 to provide an example.

At step 706, the exemplary operation flow 700 operates on the serial input sequence of data delivered in step 704 in the shift mode of operation. In an exemplary embodiment, internal circuitry under test of the memory device, such as the internal circuitry under test 202 to provide an example, can simply pass through the serial input sequence of data delivered in step 704 to provide a serial output sequence of data, such as the output sequence of test data 156 to provide an example.

At step 708, the exemplary operation flow 700 selects the serial output sequence of data from among the serial output sequence of data and an output sequence of scan data, such as the serial output sequence of scan data 154 to provide an example, in the shift mode of operation. In an exemplary embodiment, multiplexing circuitry, such as the second multiplexing circuitry 118 to provide an example, selects the serial output sequence of data from among the serial output sequence of data and the output sequence of scan data.

Exemplary Capture Mode of Operation

Figure 8:
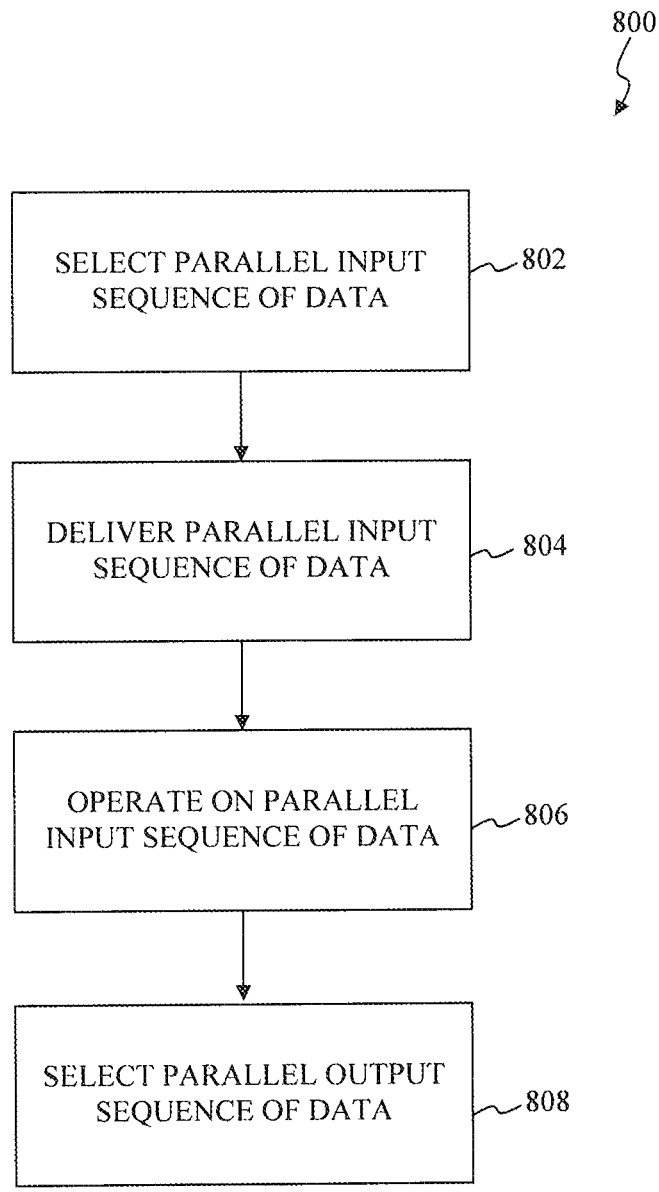
FIG. 8 illustrates a flowchart of an exemplary capture mode of operation of the exemplary testing environment according to an exemplary embodiment of the present disclosure.

FIG. 8 illustrates a flowchart of an exemplary capture mode of operation of the exemplary testing environment according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes exemplary operation flow 800 for a capture mode of operation of an exemplary testing environment, such as the exemplary testing environment 100 to provide an example.

At step 802, the exemplary operation flow 800 selects a parallel input sequence of data, such as the parallel input sequence of data 152 to provide an example, from among a serial input sequence of data, such as the serial input sequence of data 150 to provide an example and the parallel input sequence of data in the capture mode of operation. In an exemplary embodiment, multiplexing circuitry, such as the first multiplexing circuitry 110 to provide an example, selects the parallel input sequence of data from among the serial input sequence of data and the parallel input sequence of data.

At step 804, the exemplary operation flow 800 delivers the parallel input sequence of data to a memory device, such as the memory device 114, the memory device 200, the memory device 300, the memory device 400, the memory device 500, or the memory device 600 to provide some examples, in the capture mode of operation. In an exemplary embodiment, latching circuitry, such as the first latching circuitry 112 to provide an example, delivers the parallel input sequence of data to the memory device in accordance with a memory clocking signal, such as the memory clocking signal 164 to provide an example.

At step 806, the exemplary operation flow 800 operates on the parallel input sequence of data delivered in step 804 in the capture mode of operation. In an exemplary embodiment, internal circuitry under test of the memory device, such as the internal circuitry under test 202 to provide an example, can simply pass through the parallel input sequence of data delivered in step 804 to provide a parallel output sequence of data, such as the output sequence of test data 156 to provide an example.

At step 808, the exemplary operation flow 800 selects the parallel output sequence of data from among the parallel output sequence of data and an output sequence of scan data, such as the serial output sequence of scan data 154 to provide an example, in the capture mode of operation. In an exemplary embodiment, multiplexing circuitry, such as the second multiplexing circuitry 118 to provide an example, selects the parallel output sequence of data from among the parallel output sequence of data and the output sequence of scan data.

Exemplary Scan Mode of Operation

Figure 9:
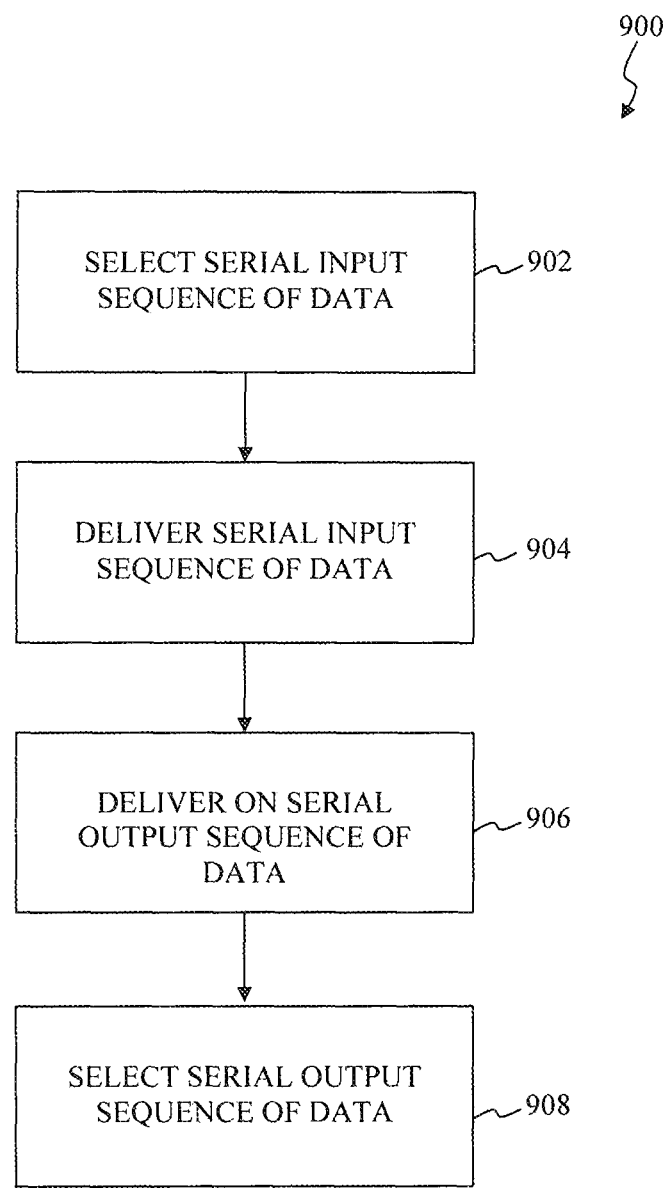
FIG. 9 illustrates a flowchart of an exemplary scan mode of operation of the exemplary testing environment according to an exemplary embodiment of the present disclosure.

FIG. 9 illustrates a flowchart of an exemplary scan mode of operation of the exemplary testing environment according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes exemplary operation flow 900 for a scan mode of operation of an exemplary testing environment, such as the exemplary testing environment 100 to provide an example.

At step 902, the exemplary operation flow 700 selects a serial input sequence of data, such as the serial input sequence of data 150 to provide an example, from among the serial input sequence of data and a parallel input sequence of data, such as the parallel input sequence of data 152 to provide an example, in the scan mode of operation. In an exemplary embodiment, multiplexing circuitry, such as the first multiplexing circuitry 110 to provide an example, selects the serial input sequence of data from among the serial input sequence of data and the parallel input sequence of data.

At step 904, the exemplary operation flow 900 delivers the exemplary operation flow 900 delivers the serial input sequence of data to latching circuitry, such as the second latching circuitry 116 to provide an example, in the scan mode of operation. In an exemplary embodiment, other latching circuitry, such as the first latching circuitry 112 to provide an example, delivers the serial input sequence of data to the latching circuitry in accordance with a memory clocking signal, such as the memory clocking signal 164 to provide an example.

At step 906, the exemplary operation flow 900 delivers the serial input sequence of data delivered in step 904 as an output sequence of scan data, such as the serial output sequence of scan data 154 to provide an example. In an exemplary embodiment, the latching circuitry of step 904 delivers the output sequence of scan data.

At step 908, the exemplary operation flow 900 selects the output sequence of scan data from among a serial output sequence of data, such as the output sequence of test data 156 to provide an example, and the output sequence of scan data in the scan mode of operation. In an exemplary embodiment, multiplexing circuitry, such as the second multiplexing circuitry 118 to provide an example, selects the output sequence of scan data from among the serial output sequence of data and the output sequence of scan data.

CONCLUSION

The foregoing Detailed Description discloses a memory storage device. The memory storage device includes first multiplexing circuitry, first latching circuitry, a memory device including a memory array, internal circuitry under test, and internal circuitry not under test, second latching circuitry, and second multiplexing circuitry. The first multiplexing circuitry provides a serial sequence of data or a parallel sequence of data as an input sequence of data. The first latching circuitry provides the input sequence of data as a testing sequence of data in accordance with a memory clocking signal. The internal circuitry under test operates on the testing sequence of data to provide a serial sequence of output data or a parallel sequence of output data. The memory array and the internal circuitry not under test are disabled. The second latching circuitry provides the testing sequence of data as a second serial sequence of output data in accordance with the memory clocking signal. The second multiplexing circuitry provides the serial sequence of output data, the parallel sequence of output data, or the second serial sequence of output data as an output sequence of data.

The foregoing Detailed Description also discloses a memory device. The memory device includes a memory array, row selection circuitry, column selection circuitry, a sense amplifier/write driver, and an output latch. The memory array, the row selection circuitry, the column selection circuitry, and the sense amplifier/write are disabled in a testing mode of operation. The output latch receives an input sequence of data in the testing mode of operation in accordance with a memory clocking signal, operates on the input sequence of data to provide an output sequence of data in the testing mode of operation, and delivers the output sequence of data in accordance with the clocking signal in the testing mode of operation.

The foregoing Detailed Description further discloses a method for operating a memory storage device. The method includes: providing, by the memory storage device, a serial sequence of data in a first mode of operation or in a second mode of operation or a parallel sequence of data in a third mode of operation, passing through, by first internal circuitry of a memory device of the memory storage device, the serial sequence of data in the first mode of operation and the parallel sequence of data in the third mode of operation to provide a first sequence of output data, disabling, by the memory storage device, second internal circuitry of the memory device, passing through, by latching circuitry of the memory storage device, the serial sequence of data in the second mode of operation to provide a second sequence of output data, and providing, by the memory storage device, the first sequence of output data in the first mode of operation and in the third mode of operation or the second sequence of output data in the second mode of operation.

The foregoing Detailed Description referred to accompanying figures to illustrate exemplary embodiments consistent with the disclosure. References in the foregoing Detailed Description to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The foregoing Detailed Description is not meant to limiting. Rather, the scope of the disclosure is defined only in accordance with the following claims and their equivalents. It is to be appreciated that the foregoing Detailed Description, and not the following Abstract section, is intended to be used to interpret the claims. The Abstract section can set forth one or more, but not all exemplary embodiments, of the disclosure, and thus, is not intended to limit the disclosure and the following claims and their equivalents in any way.

The exemplary embodiments described within foregoing Detailed Description have been provided for illustrative purposes, and are not intended to be limiting. Other exemplary embodiments are possible, and modifications can be made to the exemplary embodiments while remaining within the spirit and scope of the disclosure. The foregoing Detailed Description has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The foregoing Detailed Description fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A method for operating a memory storage device, the memory storage device including a memory array, circuitry under test, and circuitry not under test, the method comprising:
   disabling, by the memory storage device, the memory array and the circuitry not under test;
   selecting, by first multiplexing circuitry within the memory storage device, a serial sequence of data or a parallel sequence of data to be an input sequence of data;
   providing, by first latching circuitry within the memory storage device, the input sequence of data in accordance with a memory clocking signal;
   operating on, by the circuitry under test, the input sequence of data to provide a serial sequence of output data or a parallel sequence of output data;
   providing, by second latching circuitry within the memory storage device, the input sequence of data as a second serial sequence of output data in accordance with the memory clocking signal; and
   selecting, by second multiplexing circuitry within the memory storage device, the serial sequence of output data, the parallel sequence of output data, or the second serial sequence of output data as an output sequence of data.

2. The method of claim 1, wherein the selecting the serial sequence of output data, the parallel sequence of output data, or the second serial sequence of output data as the output sequence of data comprises:
   selecting, by the second multiplexing circuitry, the parallel sequence of output data or the second serial sequence of output data as the output sequence of data, and
   wherein the method further comprises:
      providing, by the second multiplexing circuitry, the output sequence of data to functional logic circuitry coupled to the memory storage device to electronically stress the functional logic circuitry to test for a presence of a manufacturing fault in the functional logic circuitry.

3. The method of claim 1, wherein the selecting the serial sequence of output data, the parallel sequence of output data, or the second serial sequence of output data as the output sequence of data comprises:
   selecting, by the second multiplexing circuitry, the serial sequence of output data as the output sequence of data, and
   wherein the method further comprises:
      providing, by the second multiplexing circuitry, the output sequence of data to functional logic circuitry coupled to the memory storage device to analyze the output sequence of data to determine whether the circuitry under test operates as expected.

4. The method of claim 3, wherein the circuitry under test operates as expected when the output sequence of data matches an expected value of the output sequence of data and operates unexpectedly when the output sequence of data does not match the expected value of the output sequence of data.

5. The method of claim 1, wherein the circuitry not under test comprises one or more of: row selection circuitry, column selection circuitry, and a sense amplifier/write driver, and
   wherein the disabling comprises:
      disabling, by the memory storage device, the row selection circuitry, the column selection circuitry, or the sense amplifier/write driver.

6. The method of claim 1, wherein the circuitry under test comprises one or more of: an output latch, a sense amplifier/write driver, and third multiplexing circuitry, and
   wherein the operating on the input sequence of data comprises:
      operating on, by the output latch, the sense amplifier/write driver, or the third multiplexing circuitry, the input sequence of data to provide the serial sequence of output data or the parallel sequence of output data.

7. The method of claim 1, wherein the providing the input sequence of data in accordance with the memory clocking signal comprises:
   providing, by the first latching circuitry, the input sequence of data upon a rising edge of the memory clocking signal, and
   wherein the providing the input sequence of data as the second serial sequence of output data in accordance with the memory clocking signal comprises:
      providing, by the second latching circuitry, the input sequence of data as the second serial sequence of output data upon a falling edge of the memory clocking signal.

8. The method of claim 1, wherein the providing the input sequence of data as the second serial sequence of output data comprises:
   passing through the input sequence of data to provide the second serial sequence of output data in accordance with the memory clocking signal.

9. A memory storage device, comprising:
   first latching circuitry configured to:
      provide a serial sequence of input data in a shift mode of operation or a scan mode of operation, and
      provide a parallel sequence of input data in a capture mode of operation;
   a memory device configured to:
      operate on the serial sequence of input data to provide a serial sequence of output data in the shift mode of operation, and
      operate on the parallel sequence of input data to provide a parallel sequence of output data in the capture mode of operation;
   second latching circuitry configured to pass through the serial sequence of input data to provide a second serial sequence of output data in the scan mode of operation; and
   multiplexing circuitry configured to:
      provide the serial sequence of output data in the shift mode of operation,
      provide the parallel sequence of output data in the capture mode of operation, and provide the second serial sequence of output data in the scan mode of operation.

10. The memory storage device of claim 9, wherein the multiplexing circuitry is configured to:
provide the parallel sequence of output data in the capture mode of operation or the second serial sequence of output data in the scan mode of operation to electronically stress functional logic circuitry coupled to the memory storage device to test for a presence of a manufacturing fault in the functional logic circuitry.

11. The memory storage device of claim 9, wherein the multiplexing circuitry is configured to provide the serial sequence of output data in the shift mode of operation to functional logic circuitry coupled to the memory storage device to analyze the output sequence of data to determine whether the circuitry under test operates as expected.

12. The memory storage device of claim 11, wherein the circuitry under test operates as expected when the output sequence of data matches an expected value of the output sequence of data and operates unexpectedly when the output sequence of data does not match the expected value of the output sequence of data.

13. The memory storage device of claim 9, wherein the memory device comprises one or more of: row selection circuitry, column selection circuitry, and a sense amplifier/write driver, and
wherein the row selection circuitry, the column selection circuitry, or the sense amplifier/write driver are configured to be disabled in the shift mode of operation and the capture mode of operation.

14. The memory storage device of claim 9, wherein the circuitry under test comprises one or more of: an output latch, a sense amplifier/write driver, and third multiplexing circuitry and
wherein the output latch, the sense amplifier/write driver, or the third multiplexing circuitry is configured to:
operate on the serial sequence of input data to provide the serial sequence of output data in the shift mode of operation, and
operate on the parallel sequence of input data to provide the parallel sequence of output data in the capture mode of operation.

15. The memory storage device of claim 9, wherein the first latching circuitry is configured to:
provide the serial sequence of input data upon a rising edge of a memory clocking signal, and
provide a parallel sequence of input data upon the rising edge of a memory clocking signal, and
wherein the second latching circuitry is configured to pass through the serial sequence of input data upon a falling edge of the memory clocking signal.

16. A system, comprising:
first functional logic circuitry configured to provide a serial input sequence of data or a parallel input sequence of data;
a memory storage device configured to:
operate on the serial input sequence of data to provide a first serial output sequence of data in a first mode of operation;
operate on the parallel input sequence of data to provide a parallel output sequence of data in a second mode of operation; and
pass-through the serial input sequence of data to provide a second serial output sequence of data in a third mode of operation; and
second functional logic circuitry configured to:
analyze the first serial output sequence of data to determine whether the memory storage device operates as expected or unexpectedly; and
be electronically stressed by the parallel output sequence of data or the second serial output sequence of data to test for a presence of a manufacturing fault in the second functional logic circuitry.

17. The system of claim 16, wherein the memory storage device operates as expected when the output sequence of data matches an expected value of the output sequence of data and operates unexpectedly when the output sequence of data does not match the expected value of the output sequence of data.

18. The system of claim 16, wherein the memory storage device comprises one or more of: row selection circuitry, column selection circuitry, and a sense amplifier/write driver, and
wherein the row selection circuitry, the column selection circuitry, or the sense amplifier/write driver are configured to be disabled in the first mode of operation and the second mode of operation.

19. The system of claim 16, wherein the circuitry under test comprises one or more of: an output latch, a sense amplifier/write driver, and third multiplexing circuitry and
wherein the output latch, the sense amplifier/write driver, or the third multiplexing circuitry is configured to:
operate on the serial sequence of input data to provide the serial sequence of output data in the first mode of operation, and
operate on the parallel sequence of input data to provide the parallel sequence of output data in the second mode of operation.

20. The system of claim 16, wherein the first functional logic circuitry is configured to provide the serial input sequence of data in the first mode of operation or the third mode of operation or a parallel input sequence of data in the second mode of operation.

* * * * *